(12) United States Patent
Fan

(10) Patent No.: US 10,784,399 B2
(45) Date of Patent: Sep. 22, 2020

(54) METHOD FOR FABRICATING GRAPHENE LIGHT EMITTING TRANSISTOR

(71) Applicant: TCL China Star Optoelectronics Technology Co.,Ltd., Shenzhen (CN)

(72) Inventor: Yong Fan, Guangdong (CN)

(73) Assignee: TCL CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 0 days.

(21) Appl. No.: 16/743,039

(22) Filed: Jan. 15, 2020

(65) Prior Publication Data

US 2020/0152824 A1 May 14, 2020

Related U.S. Application Data

(62) Division of application No. 15/523,371, filed on Apr. 29, 2017, now Pat. No. 10,580,930.

(51) Int. Cl.
| | |
|---|---|
| *H01L 33/00* | (2010.01) |
| *H01L 33/06* | (2010.01) |
| *H01L 27/12* | (2006.01) |
| *H01L 27/15* | (2006.01) |
| *H01L 33/34* | (2010.01) |

(Continued)

(52) U.S. Cl.
CPC ........... *H01L 33/0041* (2013.01); *G09G 3/30* (2013.01); *H01L 27/124* (2013.01); *H01L 27/1255* (2013.01); *H01L 27/156* (2013.01); *H01L 29/7869* (2013.01); *H01L 29/78684* (2013.01); *H01L 33/0054* (2013.01); *H01L 33/06* (2013.01); *H01L 33/34* (2013.01); *G09G 3/2003* (2013.01); *G09G 3/32* (2013.01); *G09G 2300/0426* (2013.01); *G09G 2300/0809* (2013.01); *G09G 2300/0814* (2013.01); *G09G 2300/0842* (2013.01); *G09G 2320/0666* (2013.01); *H01L 33/405* (2013.01); *H01L 33/44* (2013.01); *H01L 2933/0016* (2013.01); *H01L 2933/0025* (2013.01)

(58) Field of Classification Search
None
See application file for complete search history.

(56) References Cited

U.S. PATENT DOCUMENTS

| | | | |
|---|---|---|---|
| 2016/0020420 A1* | 1/2016 | Lee | H01L 51/442 136/256 |
| 2018/0102087 A1* | 4/2018 | Fan | G09G 3/32 |
| 2018/0149897 A1* | 5/2018 | Fan | G02F 1/133553 |

OTHER PUBLICATIONS

"The reduction of graphene oxide" by Pei et al. (Year: 2011).*
"Reduced Graphene Oxide as Efficient Hole Injection Layer for Quantum-Dot Light-Emitting Diodes" by Song et al. (Year: 2018).*

* cited by examiner

*Primary Examiner* — Evren Seven
(74) *Attorney, Agent, or Firm* — Leong C. Lei

(57) ABSTRACT

A method is provided for fabricating a graphene light emitting transistor. The method includes: forming a gate electrode on a substrate; forming a gate insulating layer on the substrate and the gate electrode; forming a graphene oxide layer on the gate insulating layer; reducing two ends of the graphene oxide layer to respectively form a source electrode and a drain electrode made of graphene; forming a graphene quantum dot layer on an unreduced part of the graphene oxide layer, the source electrode, and the drain electrode; and forming a water and oxygen resistant layer on the graphene quantum dot layer.

3 Claims, 4 Drawing Sheets

(51) Int. Cl.
*G09G 3/30* (2006.01)
*H01L 29/786* (2006.01)
*H01L 33/44* (2010.01)
*H01L 33/40* (2010.01)
*G09G 3/32* (2016.01)
*G09G 3/20* (2006.01)

METHOD FOR FABRICATING GRAPHENE LIGHT EMITTING TRANSISTOR

CROSS REFERENCE TO RELATED APPLICATIONS

This is a divisional application of co-pending U.S. patent application Ser. No. 15/523,371, filed on Apr. 29, 2017, which is a national stage of PCT Application No. PCT/CN2017/078970, filed on Mar. 31, 2017, claiming foreign priority of Chinese Patent Application No. 201710087525.7 filed on Feb. 17, 2017.

FIELD OF THE INVENTION

The present application relates to a display technology field, and more particularly to a method for fabricating a graphene light emitting transistor.

BACKGROUND OF THE INVENTION

Graphene, because of its hard texture, high transparency (its transmittance is about 97.7%), high thermal conductivity (up to 5300 W/m·K), high electron mobility (more than 15000 cm2/V·s) and other excellent features, is gradually applied to the display apparatus, especially in the applications for touch panel in recent years (which is commonly used as an alternative to conventional transparent indium tin oxide (ITO) conductive films) and in the applications in light emitting diode (LED).

SUMMARY OF THE INVENTION

The present disclosure applies graphene to a transistor to construct a graphene light emitting transistor, and utilizes the constructed graphene light emitting transistor to realize an active graphene light emitting display apparatus.

According to an aspect of the present disclosure, a graphene light emitting transistor is provided, including: a gate electrode disposed on a substrate; a gate insulating layer disposed on the substrate and the gate electrode; a source electrode and a drain electrode disposed on the gate insulating layer, wherein the source electrode and the drain electrode are formed by graphene; a graphene oxide layer disposed on the gate insulating layer and located between the source electrode and the drain electrode; a graphene quantum dot layer disposed on the graphene oxide layer, the source electrode and the drain electrode; and a water and oxygen resistant layer disposed on the graphene quantum dot layer.

Alternatively, the graphene light emitting transistor further includes a protective layer disposed on the water and oxygen resistant layer.

Alternatively, the gate electrode is a composite metal layer and the reflectivity of the gate electrode is not less than 80%.

Alternatively, by controlling the voltage supplied to the gate electrode, the color of the light emitted from the graphene light emitting transistor is controlled.

According to another aspect of the present disclosure, a method of fabricating a graphene light emitting transistor is also provided, including: forming a gate electrode on a substrate; forming a gate insulating layer on the substrate and the gate electrode; forming a graphene oxide layer on the gate insulating layer; reducing both ends of the graphene oxide layer respectively to form a source electrode and a drain electrode made of graphene; forming a graphene quantum dot layer on the unreduced graphene oxide layer, the source electrode, and the drain electrode; forming a water and oxygen resistant layer on the graphene quantum dot layer.

Alternatively, the method of fabricating further includes forming a protective layer on the water and oxygen resistant layer.

According to another aspect of the present disclosure, an active graphene light emitting light emitting display apparatus is provided, including: a gate line, a data line, a color control voltage line, a power supply voltage line, a driving thin film transistor, a switching thin film transistor, a graphene light emitting transistor and a storage capacitor, wherein the graphene light emitting transistor including: a gate electrode disposed on a substrate; a gate insulating layer disposed on the substrate and the gate electrode; a source electrode and a drain electrode disposed on the gate insulating layer, wherein the source electrode and the drain electrode are formed by graphene; a graphene oxide layer disposed on the gate insulating layer and located between the source electrode and the drain electrode; a graphene quantum dot layer disposed on the graphene oxide layer, the source electrode and the drain electrode; and a water and oxygen resistant layer disposed on the graphene quantum dot layer; the gate lines and the data lines are insulated from each other and crossover-set; the color control voltage lines are parallel to the gate lines and are used to transmit the color control voltage; a gate electrode and a source electrode of the driving thin film transistor are connected to the gate line and the data line, respectively; a drain electrode of the driving thin film transistor is connected to a gate electrode of the switching thin film transistor; a source electrode of the switching thin film transistor is connected to the power supply voltage line, a drain electrode of the switching thin film transistor is connected to a source electrode of the graphene light emitting transistor; a gate electrode of the graphene light emitting transistor is connected to the color control voltage line, and a drain electrode of the graphene light emitting transistor is electrically connected to ground; one end of the storage capacitor is connected to the gate electrode of the switching thin film transistor, the other end of the storage capacitor is connected to the power supply voltage line.

Alternatively, by controlling the voltage supplied to the gate electrode, the color of the light emitted from the graphene light emitting transistor is controlled.

Alternatively, when the color control voltage is between the first predetermined voltage and the second predetermined voltage, the graphene light emitting transistor emits red light; when the color control voltage is between the third predetermined voltage and the fourth predetermined voltage, the graphene light emitting transistor emits green light; when the color control voltage is between the fifth predetermined voltage and the sixth predetermined voltage, the graphene light emitting transistor emits blue light; wherein the first predetermined voltage to the sixth predetermined voltage is sequentially increased.

Advantageous effects of the disclosure: the present disclosure constructs a graphene light emitting transistor and utilizes the graphene light emitting transistor to realize an active graphene light emitting display apparatus.

BRIEF DESCRIPTION OF THE DRAWINGS

In order to more clearly illustrate the embodiments of the present application or prior art, the following figures will be described in the embodiments are briefly introduced. It is obvious that the drawings are merely some embodiments of the present application, those of ordinary skill in this field can obtain other figures according to these figures without paying the premise.

DETAILED DESCRIPTION OF PREFERRED EMBODIMENTS

Figure 1:
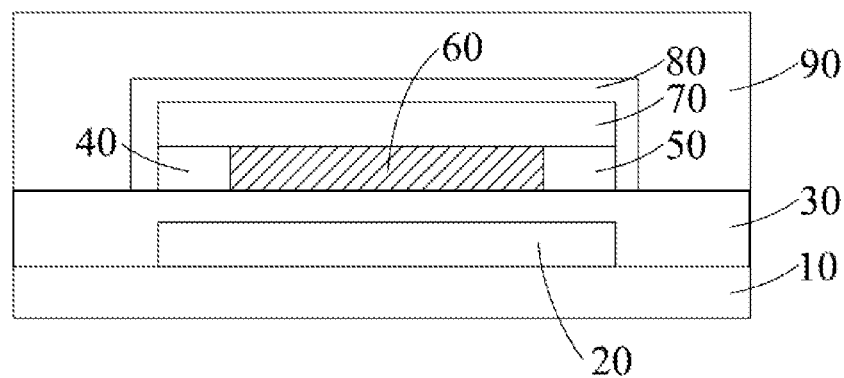
FIG. 1 is a schematic structural view of a graphene light emitting transistor according to an embodiment of the present disclosure.

Embodiments of the present application are described in detail with the technical matters, structural features, achieved objects, and effects with reference to the accompanying drawings as follows. It is clear that the described embodiments are part of embodiments of the present application, but not all embodiments. Based on the embodiments of the present application, all other embodiments to those of ordinary skill in the premise of no creative efforts acquired should be considered within the scope of protection of the present application.

Specifically, the terminologies in the embodiments of the present application are merely for describing the purpose of the certain embodiment, but not to limit the invention.

In the drawings, the thickness of the layers and regions is exaggerated in order to clarify the device. The same reference numerals refer to like elements and devices throughout the specification and drawings.

FIG. 1 is a schematic structural view of a graphene light emitting transistor according to the embodiment of the present disclosure.

Referring to FIG. 1, the graphene light emitting transistor according to the embodiment of the present disclosure includes: a substrate 10, a gate electrode 20, a gate insulating layer 30, a source electrode 40, a drain electrode 50, a graphene oxide layer 60, a graphene quantum dot layer 70, and a water and oxygen resistant layer 80.

The substrate 10 can be, for example, a transparent glass substrate or a transparent resin substrate.

The gate electrode 20 is formed on the substrate 10. The gate electrode 20 should have a higher reflectivity. Preferably, in the present embodiment, the reflectivity of the gate electrode 20 is not less than 80%. As an embodiment, the gate electrode 20 can be a composite metal layer such as a molybdenum aluminum alloy, an aluminum silver alloy, a copper molybdenum aluminum alloy, or the like, but the present disclosure is not limited thereto.

The gate insulating layer 30 is disposed on the substrate 10 and covers the gate electrode 20. The gate insulating layer 30 can be formed of, for example, an insulating material such as silicon oxide, silicon nitride, or the like.

The source electrode 40 and the drain electrode 50 are spaced apart and disposed on the gate insulating layer 30. In the present embodiment, the source electrode 40 and the drain electrode 50 are made of graphene. Further, the graphene can be formed by reducing the graphene oxide, thereby forming the source electrode 40 and the drain electrode 50.

The graphene oxide layer 60 is disposed on the gate insulating layer 30 and is located between the source electrode 40 and the drain electrode 50. Further, the graphene oxide layer 60 is in contact with both of the source electrode 40 and the drain electrode 50.

The graphene quantum dot layer 70 is disposed on the graphene oxide layer 60, the source electrode 40 and the drain electrode 50. The water and oxygen resistant layer 80 is disposed on the graphene quantum dot layer 70 for preventing from the water and oxygen presence in the environment into the device.

Further, the graphene light emitting transistor according to the embodiment of the present disclosure can further include a protective layer 90. The protective layer 90 is disposed on the water and oxygen resistant layer 80 for protecting the water and oxygen resistant layer 80.

In the present embodiment, by controlling the voltage supplied to the gate electrode 20, the color of the light emitted from the graphene light emitting transistor according to the embodiment of the present disclosure is controlled. The detail will be described below.

Hereinafter, a method of fabricating the graphene light emitting transistor according to the embodiment of the present disclosure will be described. FIGS. 2A to 2H are flowcharts for fabricating the graphene light emitting transistor according to the embodiment of the present disclosure.

Figure 2A:
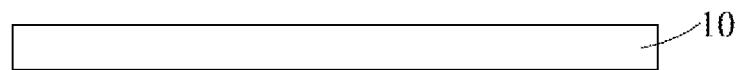
FIGS. 2A to 2H are flowcharts for fabricating the graphene light emitting transistor according to an embodiment of the present disclosure.

Referring to FIG. 2A, providing the substrate 10. The substrate 10 can be, for example, a transparent glass substrate or a transparent resin substrate.

Figure 2B:
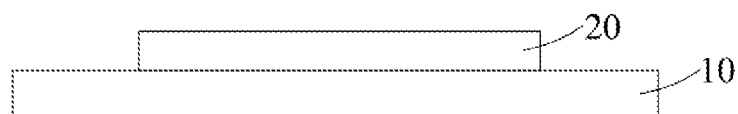

Referring to FIG. 2B, forming the gate electrode 20 on the substrate 10. The gate electrode 20 should have a higher reflectivity. Preferably, in the present embodiment, the reflectivity of the gate electrode 20 is not less than 80%. As an embodiment, the gate electrode 20 can be a composite metal layer such as a molybdenum aluminum alloy, an aluminum silver alloy, a copper molybdenum aluminum alloy, or the like, but the present disclosure is not limited thereto.

Figure 2C:
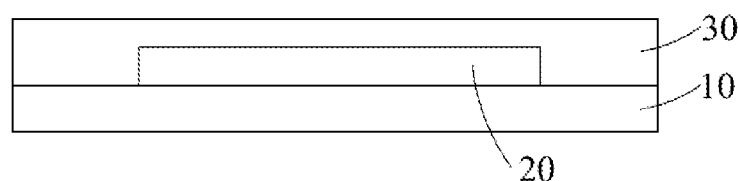

Referring to FIG. 2C, forming the gate insulating layer 30 on the substrate 10 and covering the gate electrode 20. The gate insulating layer 30 can be formed of, for example, an insulating material such as silicon oxide, silicon nitride, or the like.

Figure 2D:
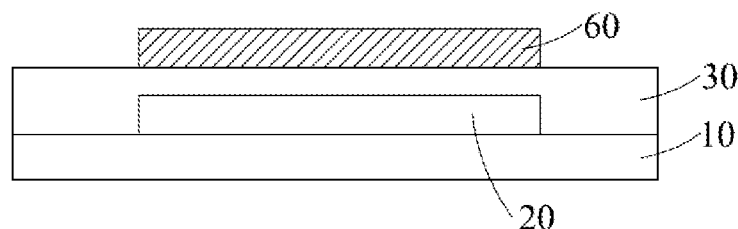

Referring to FIG. 2D, forming the graphene oxide layer 60 on the gate insulating layer 30.

Figure 2E:
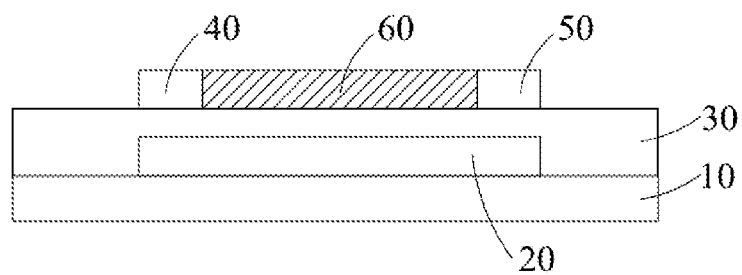

Referring to FIG. 2E, reducing the both ends of the graphene oxide layer 60 respectively to form the source electrode 40 and the drain electrode 50 made of graphene.

Figure 2F:
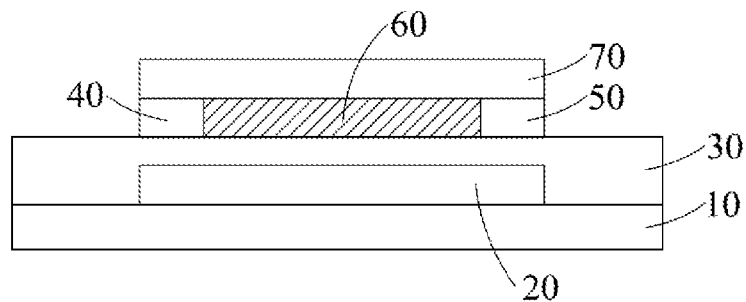

Referring to FIG. 2F, forming the graphene quantum dot layer 70 on the unreduced graphene oxide layer 60, the source electrode 40, and the drain electrode 50.

Figure 2G:
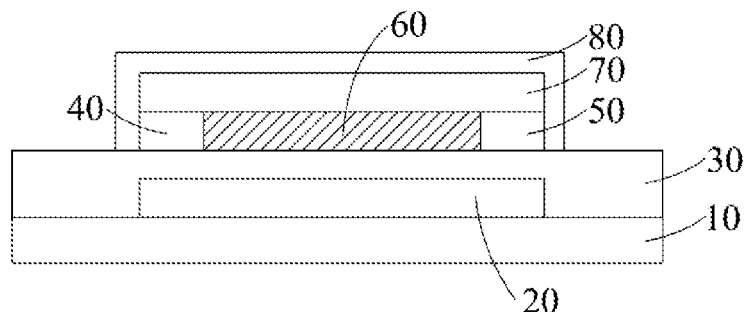

Referring to FIG. 2G, forming the water and oxygen resistant layer 80 on the graphene quantum dot layer 70 for preventing from the water and oxygen presence in the environment into the device.

Figure 2H:
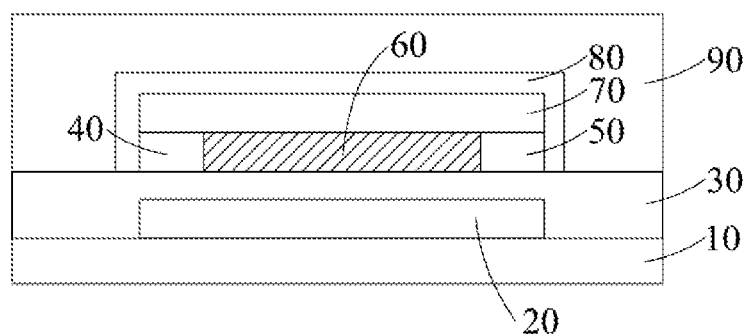

Referring to FIG. 2H, forming the protective layer 90 on the water and oxygen resistant layer 80, the protective layer 90 is used for protecting the water and oxygen resistant layer 80.

It is understood that in another embodiment of the present disclosure, the method of fabricating the graphene light emitting transistor according to the embodiment of the present disclosure is also possible of not including the step shown in FIG. 2H.

Figure 3:
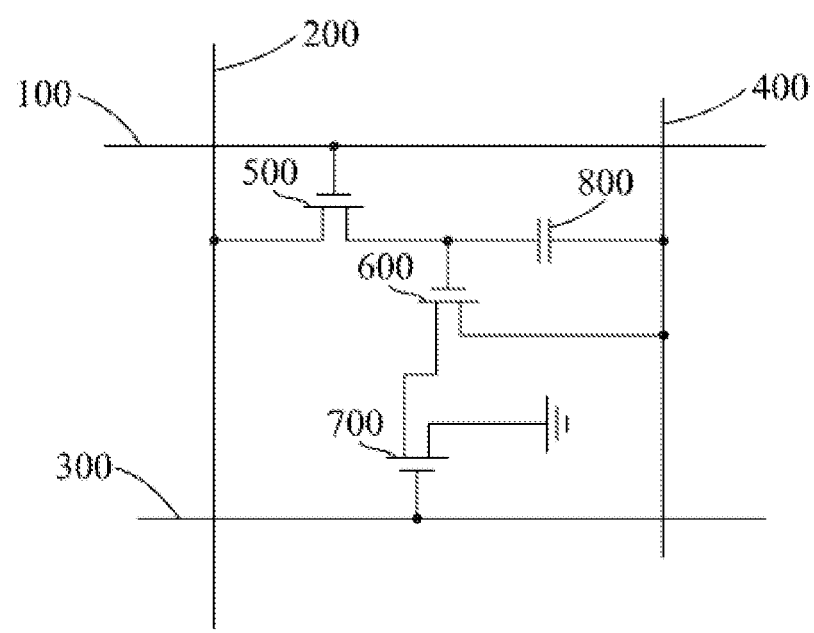
FIG. 3 is a circuit diagram of pixels of an active graphene light emitting display apparatus according to an embodiment of the present disclosure.

Hereinafter, an active graphene light emitting light emitting display apparatus adapting the graphene light emitting transistor of the present embodiment will be described in detail. FIG. 3 is a circuit diagram of pixel of the active graphene light emitting display apparatus according to an embodiment of the present disclosure. In FIG. 3, only one pixel is shown, however it should be understood that the other pixels in the active graphene light emitting display apparatus are the same as the pixels shown in FIG. 3.

Referring to FIG. 3, the active graphene light emitting display apparatus according to an embodiment of the present disclosure includes a gate line 100, a data line 200, a color control voltage line 300, a power supply voltage line 400, a driving thin film transistor 500, a switching thin film transistor 600, a graphene light emitting transistor 700 and a storage capacitor 800; wherein the graphene light emitting transistor 700 is the graphene light emitting transistor shown in FIG. 1, or the graphene light emitting transistor 700 is formed by adapting the method of fabricating the graphene light emitting transistor illustrated in FIGS. 2A to 2H.

In particular, the gate lines 100 and the data lines 200 are insulated from each other and crossover-set; the color control voltage lines 300 are parallel to the gate lines 100 and are used to transmit the color control voltage; a gate electrode and a source electrode of the driving thin film transistor 500 are connected to the gate line 100 and the data line 200, respectively. A drain electrode of the driving thin film transistor 500 is connected to a gate electrode of the switching thin film transistor 600; a source electrode of the switching thin film transistor 600 is connected to the power supply voltage line 400, a drain electrode of the switching thin film transistor 600 is connected to a source electrode of the graphene light emitting transistor 700; a gate electrode of the graphene light emitting transistor 700 is connected to the color control voltage line 300, and a drain electrode of the graphene light emitting transistor 700 is electrically connected to ground; one end of the storage capacitor 800 is connected to the gate electrode of the switching thin film transistor 600, the other end of the storage capacitor 800 is connected to the power supply voltage line 400. Here, the power supply voltage line 400 is used to provide a positive voltage.

Further, the color of the emitted light of the graphene light emitting transistor 700 is controlled by controlling the color control voltage transmitted by the color control voltage line 300. In particular, the graphene light emitting transistor 700 emits red light when the color control voltage is between the first predetermined voltage and the second predetermined voltage; when the color control voltage is between the third predetermined voltage and the fourth predetermined voltage, the graphene light emitting transistor 700 emits green light; when the color control voltage is between the fifth predetermined voltage and the sixth predetermined voltage, the graphene light emitting transistor 700 emits blue light; wherein the first predetermined voltage to the sixth predetermined voltage is sequentially increased.

As one embodiment of the present disclosure, the first predetermined voltage can be 0 V, the second predetermined voltage can be 12 V, the third predetermined voltage can be 20 V, the fourth predetermined voltage can be 35 V, the fifth predetermined voltage can be 40 V, the sixth predetermined voltage can be 50 V, but the present disclosure is not limited thereto. It should be noted that the word "between" can include a boundary value or cannot include a boundary value. For example, when a predetermined voltage is 0 V, "between" does not include 0 V.

In view of the above, according to the embodiment of the present disclosure, the graphene light emitting transistor is constructed and the active graphene light emitting display apparatus is realized by utilizing the graphene light emitting transistor.

Above are embodiments of the present application, which does not limit the scope of the present application. Any modifications, equivalent replacements or improvements within the spirit and principles of the embodiment described above should be covered by the protected scope of the invention.

What is claimed is:

1. A method of fabricating a graphene light emitting transistor, comprising:
   forming a gate electrode on a substrate;
   forming a gate insulating layer on the substrate and the gate electrode;
   forming a graphene oxide layer on the gate insulating layer;
   reducing both ends of the graphene oxide layer respectively to form a source electrode and a drain electrode made of graphene;
   forming a graphene quantum dot layer on the unreduced graphene oxide layer, the source electrode, and the drain electrode;
   forming a water and oxygen resistant layer on the graphene quantum dot layer.

2. The method according to claim 1, further comprising a step of forming a protective layer on the water and oxygen resistant layer.

3. The method according to claim 1, wherein the gate electrode comprises a composite metal layer and the gate electrode has reflectivity that is not less than 80%.

\* \* \* \* \*